United States Patent [19]
Verhoest et al.

[11] Patent Number: 5,455,651
[45] Date of Patent: Oct. 3, 1995

[54] APPARATUS FOR DEVELOPING A PRINTING PLATE

[76] Inventors: Bart Verhoest; Jan Claes, both of c/o Agfa-Gevaert N.V., Septestraat 27; Jos Bolders, 46, c/o Agfa-Gevaert N.V., Septestraat 27, all of B 2640 Mortsel, Belgium

[21] Appl. No.: 226,302

[22] Filed: Apr. 12, 1994

[30] Foreign Application Priority Data

May 6, 1993 [EP] European Pat. Off. .............. 93201305

[51] Int. Cl.$^6$ ................................................ G03D 17/00
[52] U.S. Cl. ............................................ 354/316; 354/320
[58] Field of Search ........................... 354/316, 319–324, 354/331, 336, 338, 339, 337, 317; 118/651, 661, 662, 648

[56] References Cited

U.S. PATENT DOCUMENTS

| | | | |
|---|---|---|---|
| 4,116,141 | 9/1978 | Nishikawa et al. | 118/648 |
| 4,534,635 | 8/1985 | Johnston et al. | 354/322 |
| 5,319,422 | 6/1994 | Ohishi et al. | 118/650 |

FOREIGN PATENT DOCUMENTS

| | | | |
|---|---|---|---|
| 3436155 | 2/1986 | Germany | 354/331 |

*Primary Examiner*—D. Rutledge
*Attorney, Agent, or Firm*—William J. Daniel

[57] ABSTRACT

Method and apparatus for DTR development of a lithographic printing plate of the type having a support possessing a natural deflection curvature under its ow weight and carrying an exposed silver halide emulsion layer in sandwiched relation an image receiving layer, wherein the plate is introduced into one end and removed from an opposite end of a DTR photographic developing bath for the emulsion layer. For such introduction, the plate is advanced through the nip of at least one pair of ingress feed rollers disposed one above the other above the bath surface along an ingress path that extends tangential to the nip at an angle of at least 5° but less than 25° to the horizontal and is unconstrained prior to its intersection with the bath surface. For its removal, the plate passes through a pair of egress feed rollers located above the bath surface along an egress path tangential to the egress roller nip at an angle of at least 5° but not more than 25> to the horizontal. While within the bath, the plate is guided, e. g. by elongated guiding bars, along a curved immersion path that has a positive curvature not substantially greater than the natural deflection curvature of the support and at its opposite ends is substantially continuous with the ingress and egress paths, The distance separating the nips of the ingress and egress roller pairs measured along the paths is less than the length of the plate. The guide bars can diverge laterally from one another.

9 Claims, 5 Drawing Sheets

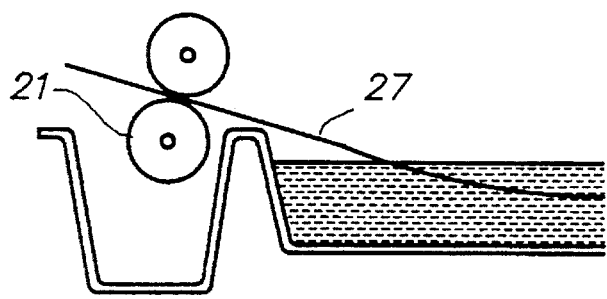
FIG. 2.1
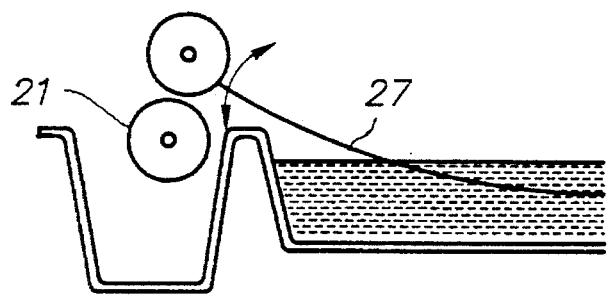
FIG. 2.2
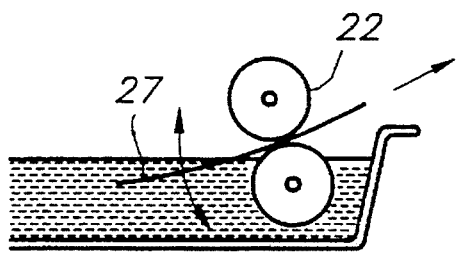
FIG. 2.3

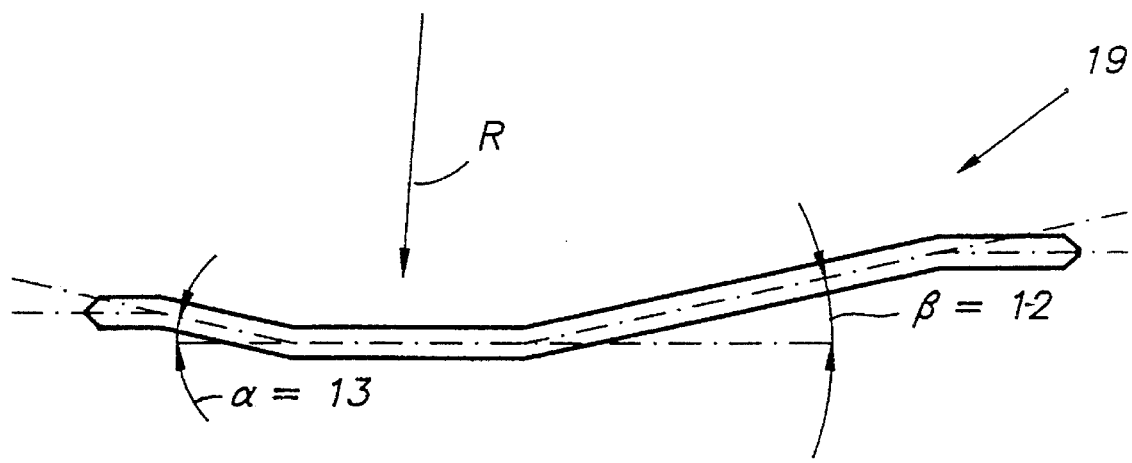
FIG. 7.1
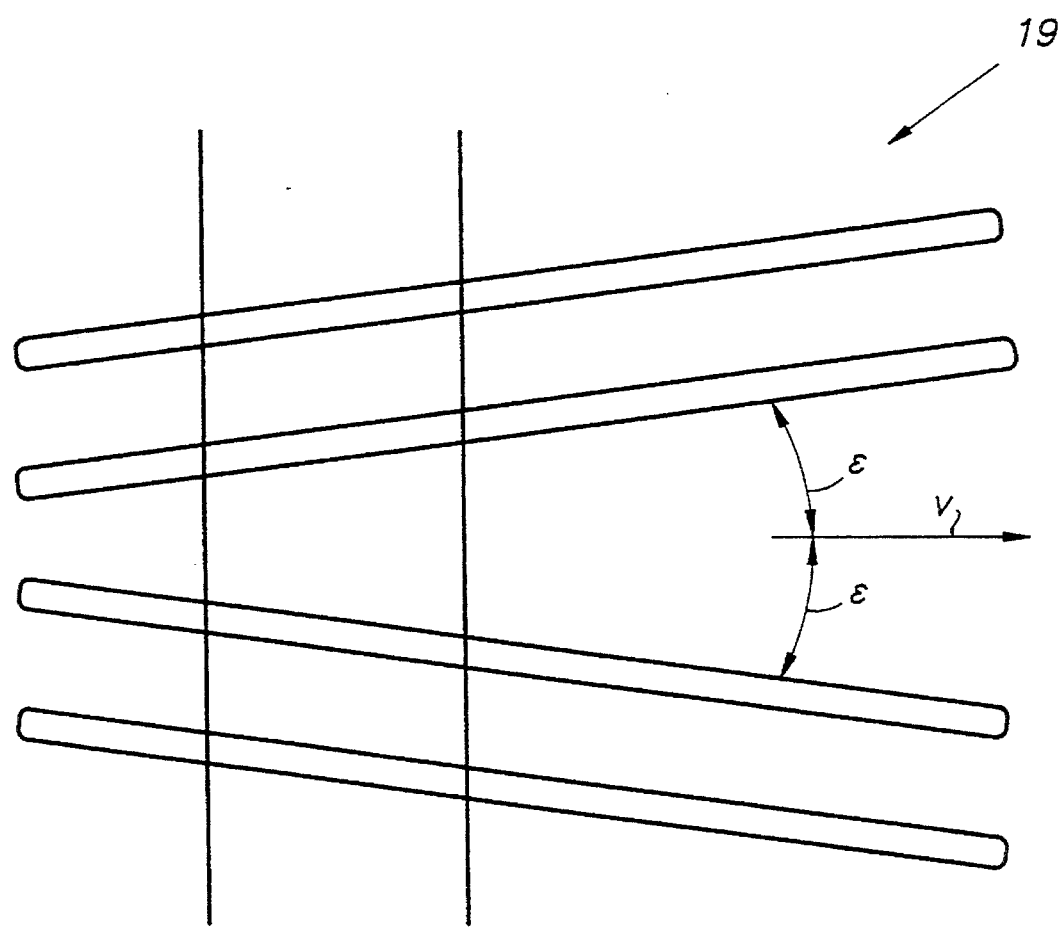
FIG. 7.2

APPARATUS FOR DEVELOPING A PRINTING PLATE

FIELD OF INVENTION

This invention relates to an apparatus for the processing of photographic sheet materials and particularly for developing lithographic offset printing plates according to a silver complex diffusion transfer reversal process.

BACKGROUND OF THE INVENTION

EP-A-410500 discloses an imaging element containing a support provided with an image receiving layer and a silver halide emulsion. In said document is disclosed a diffusion transfer reversal process (hereinafter called "DTR process") for obtaining a lithographic printing plate in which said imaging element (further commonly indicated as "printing plate") is imagewise exposed and subsequently developed using a developing liquid or activating liquid in the presence of a silver halide complexing agent. The printing plate is then guided through a diffusion transfer zone so that the silver halide complexes formed during the development step are allowed to diffuse into the image receiving layer where they are converted to silver. When the printing plate leaves the diffusion transfer zone a silver image is formed in the image receiving layer. Hereafter, the printing plate passes a washing and a rinsing station to remove the silver halide emulsion layer so that the silver image is exposed. Finally the printing plate, now carrying a silver image-on its surface, is treated with a finishing liquid that contains a so called hydrophobizing agent for improving the hydrophobicity of the silver image.

In an apparatus or system for the developing of such lithographic printing plates it is advantageous to maintain the length of the developing path of the printing plate in the processing liquids within specified limits so as to achieve high quality printing plates.

By controlling the length of the developing zone and the transportation speed of the printing plate, the time of development can be controlled. However, experience shows that, even if the developing time is under control, some density differences on the printing plate still may be present. Even if in addition of the developing time, also the developing fluid is under control regarding fluidlevel and flowrate and flowdistribution within the developing bath, as well as other physical and chemical characteristics (as e.g. temperature and photographic activity) a prohibitive uneveness in density remains perceptable.

At this point, a particular problem exists in the accurate geometrical control of the whole developing path of the plate, clearly including the entrance of the plate in the bath and also the exit from the bath, because some disturbing transients may occur at those positions, as e.g. first a temporary "swimming" of the printing plate on the developing fluid (caused by surface tension) and a sudden "diving or splashing" of the printing plate in the fluid (as the gravity of and/or driving force on the plate surpasses the upwards tension), followed by an uncontrolled "sweeping" out of the printing plate from the developing fluid (see FIGS. 2.1, 2.2 and 2.3).

In trying to achieve this geometrical control, some important supplementary problems make the main problem even much more difficult. One such problem encountered in practice is the secondary difficulty of making a single high quality developing apparatus capable of handling different thicknesses of the support material, and thus covering a wide spread of mechanical strength properties. A further difficulty is the fact that, the silver halide emulsion on the support material is hardened at most only slightly so that the latent image on the printing plate may easily be damaged while coming into contact with any other material or component and that eventual contacting means, as e.g. rollers, can become coated with gelatin and thus contaminating the next printing plates which still have to be processed.

Up to now, a good solution for the above-identified problem has not been. disclosed.

OBJECTS OF THE INVENTION

Accordingly it is an object of the present invention to provide an apparatus for developing a printing plate so that the printing plate is conveyed smoothly and processed efficiently and homogeneously.

Further objects will become apparent from the following description.

SUMMARY OF THE INVENTION

We now have found that the above objects can be achieved by providing an apparatus for developing a mono sheet lithographic offset printing plate according to the DTR process, comprising a developing station, wherein the guidance control of the printing plate in the developing bath, is characterised by 1) a pair of entrance rollers (21) for holding and conveying the printing plate, that are disposed at the entrance of the developing station (12), one above the other and in substantially parallel relation under an angle $\alpha$ of at least 5° to the horizontal for forcing the printing plate in a reproducible way into the developing bath (12), and 2) a pair of exit rollers (22) for removing excess development liquid on the surface of the printing plate that are disposed in substantially parallel relation, under an angle $\gamma$ to the horizontal less than. 25°, at a distance from the pair Of entrance rollers (21) so that the printing plate is guided through the developing station by at least one of the roller pairs (21) or (22), and 3) a bottom guidance member (19) for supporting the printing plate, that has a curvature radius of at least 400 mm, and an exit plane inclined upwardly for guiding the printing plate in a well defined path in the developing bath (12), such that the leading-edge of the plate is directed tangentially into the nip of said pair of exit rollers (22), defined by an angle $\beta$ to the horizontal, said angle being less than 25°, and wherein said bottom guidance member (19) has an open mesh structure.

Further embodiments of the present invention are set forth in the detailed description given hereinbelow.

DETAILED DESCRIPTION OF THE INVENTION

The invention will be described with reference to the accompanying drawings in which:

FIG. 1 is a schematic layout of processing apparatus according to the present invention;

FIGS. 2.1, 2.2 and 2.3 are schematic views of different guidance problems encountered in the processing apparatus according to the state of the art;

FIG. 7.1 and 7.2 are schematic views in side elevation of a concave bottom guidance member according to a preferred embodiment of the present invention while FIG. 7.2 is a similar schematic view in top plan.

Figure 1:
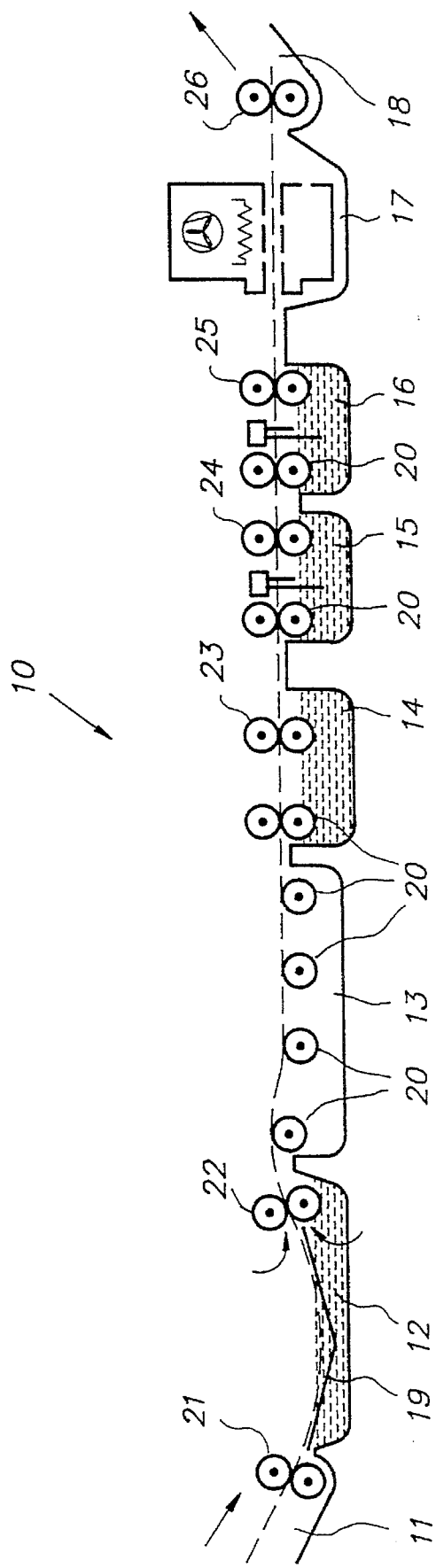

Reference is firstly made to FIG. 1 in which there is illustrated a longitudinal cross section through an apparatus 10 for processing exposed photographic sheet material, in particular lithographic printing plates of the type described in EP-A-410500.

The apparatus 10 is mounted within a generally rectangular housing which may include a rectangular metal frame (not shown) for supporting the various parts of the apparatus. According to the present invention an informationwise exposed imaging element, further on commonly indicated as "printing plate", is fed through a developing station 12 containing a processing liquid. Subsequently the printing plate is transported through a diffusion transfer zone 13 where the silver salt complexes formed are allowed to diffuse to the image receiving layer where they are converted to metallic silver. In the diffusion transfer zone the printing plate is merely transported so that by controlling the length of the zone and the transportation speed of the printing plate the time allowed for diffusion of the silver salt complexes can be controlled (e.g. a transportation length of 250 mm at a velocity of 25 mm/sec results in a transportation time of 10 sec). The printing plate then enters sequentially a washing station 14 containing a washing liquid as e.g. water, and a rinsing station 15 containing a rinsing liquid e.g. water, thereby removing the silver halide emulsion layer and other optional layers. The silver image is then treated in the finishing station 16 with a finishing liquid by guiding the printing plate through the finishing liquid. In a preferred embodiment of the present invention, the overflow of the finishing liquid may be fed into the rinsing station 15. After having passed a drying station 17, the printing plate may then leave the apparatus through the output station 18 and a lithographic printing plate is obtained.

The operation of this machine proceeds as follows. First, all the power equipment in the machine is turned on and continues to operate during the processing of a printing plate, e.g. two pumps (not shown), preferably a replenishment pump for obtaining an equal fluidlevel at any time within the developing and a recirculation pump for obtaining equal characteristics (as temperature, chemical concentration etc.) at any place within the developing solution. So, a recirculation pump recirculates developer, whereby a constant fluidlevel in the developing section 12 is realised by appropriate apertures and means (not shown) to maintain the height below said apertures. Also, the drive rollers of 20 21, 22, 23, 24, 25 and 26 are set into rotation by appropriate means (not shown).to accept a plate when it presents itself.

After the different processing stations of the apparatus are provided with the correct processing liquids, the level and temperature (e.g. between 20° C. and 30° C.) of which is adjusted to predetermined machine settings (not shown) and the drive rollers 24 rotating at a constant peripheral speed, the machine is ready to accept a printing plate for processing. A plate which was has been imagewise exposed, is introduced through the feeding means 11 into the apparatus 10.

As a possible consequence of the dynamics of the pumps (including respective starts and stops) and/or the dynamics of the rotating drive rollers the fluidlevel detection could be disturbed by reason of ondulatory motion of the surface of the developer, comprising some wave crests and some wave troughs at the surface of the fluid. In order to avoid erroneous decisions based on temporary waves of the developer fluid, the following remedy comprising three steps may be applied. First, if the level of the developer is not high enough, the replenishment pump starts replenishing the developing station with developer until a desired fluidlevel has been obtained. Second, the replenishment is intentionally extended for a supplementary filling time span, which lasts long enough to fill some extra quantity of developer, e.g. some 100 ml extra. This gives the opportunity for bridging the geometric height differences between a fluidlevel detector (not shown) and an overflow aperture (not-shown) in a side wall of the developing station. Third, once the fluidlevel has reached said desired level possible signals of a lowering level are disregarded during a certain time span, e.g. during the first 30 seconds after their beginning. If, after expiration of the disregarding time span, the detector still indicates a fluidlevel not being high enough, this signal is effectively utilised for commanding the replenishment pump to start again in order to fill or refill the station.

If the printing plate is a metal plate, as it is in the case of a aluminium plate, electrolysis between the metal printing plate and the metal level detector may occur and this may result in a supplementary electrochemical potential (e.g. about 1 Volt extra), which also could disturb the fluidlevel detector. Therefor, in accordance with the present invention, the observation of the level preferably is interrupted during the passage of a printing plate.

If the plate is a perforated plate, a length sensor may possibly catch a perforation and may interprete this perforation hole as the trailing end of the plate. Then, again a wrong decision could be taken. In order to prevent such erroneous decision, an "end signal" is only accepted from the moment it lasts longer than the time needed to transport the printing plate over a distance corresponding to the size of the largest perforation to be expected.

The disclosed remedies for "debouncing", i.e., preventing adverse effects from the fluid ondulation and the perforations can be carried out in several ways, e.g. by implementation of a software debouncing program.

To effect the transportation of the printing plate through the processing stations, rubber rollers are preferably provided to grip the plate. All the driven rollers of 20, 21, 22, 23, 24, 25 and 26 are preferably linked by a single drive train (not shown) to operate simultaneously to advance sheet material through the apparatus 10 from the feed means 11 to the output section 18. The printing plate may be gripped by more than one pair of rollers at any one time and slipping Of the rollers on the delicate surface, which would cause damage to the image, is avoided. The rollers are therefore preferably all driven at the same speed, e.g. between 1.8 and 3.5 cm/sec, preferably between 2.3 and 2.5 cm/sec, using a common chain, a belt drive or a worm wormwheel transmission.

Figure 3:
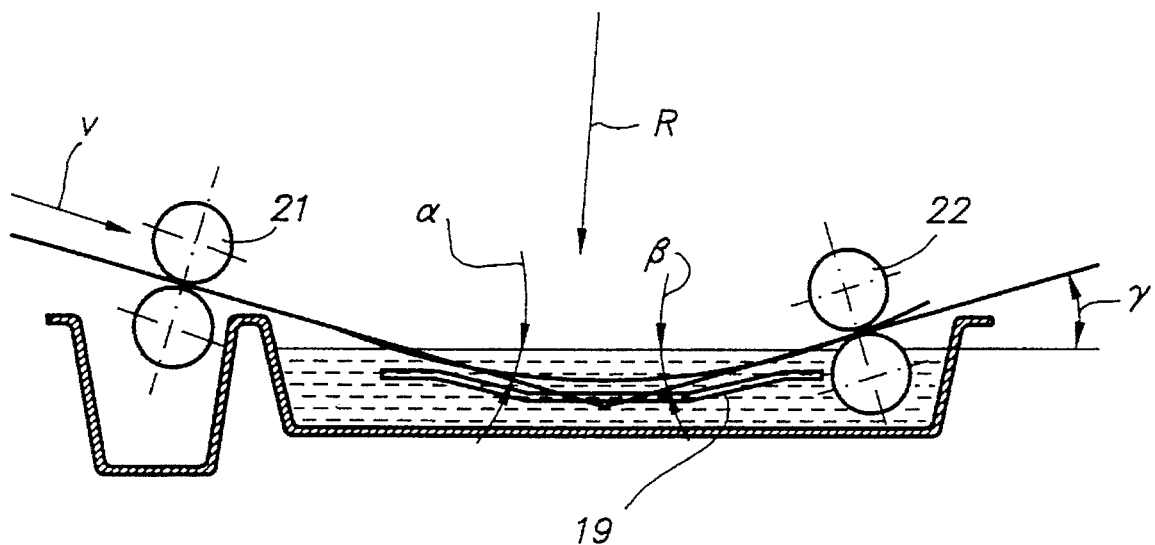
FIG. 3 is a preferred embodiment of a developing station according to the present invention.

At the entrance of the developing station is situated a pair of opposed coacting entrance rollers 21 (FIG. 3) for holding and conveying the printing plate, said entrance rollers 21 being placed outside a developing fluid, thus none of the rollers 21 being immersed into the developing fluid, both rollers 21 being disposed one above the other and in substantially parallel relation under an angle $\alpha$ of at least 5°, preferably between 5° and 25° to the horizontal for forcing the printing plate in a reproducible way into the developing bath 12.

In one of our preferred embodiments, said angle was found to be optimal at 13°, taking into account both the different stiffnesses of the plate support material and the volume of the developing bath (said volume being e.g. less than 6 liter).

As the plate is transported through the apparatus 10 by means of the entrance rollers 21, the apparatus also comprises a concave bottom guidance member 19 supporting the printing plate at its non photosensitive back, said guidance member having a well defined curvature radius R and a well defined inclination angle $\beta$ which will now be explained.

First, the well defined curvature radius R relates to the term "natural" curvature representing the curvature of the bow as it would be experienced by a support material under the sole and exclusive influence of its own weight in an aqueous liquid when supported only at its leading edge and at its trailing edge. Such radius inherently depends on the material and its dimensions, more specifically regarding specific weight (in $kg/mm^3$) and elasticity (in $N/mm^2$). Although the radius can be calculated theoretically, it is of great advantage to confirm the results by experimental measurements, especially if the available numerical data are not known very precisely. According to the present invention, said guidance member preferably has a curvature radius R of at least 400 mm, preferably between 400 and 1000 mm, corresponding to the natural curvature of the printing plate with the greatest stiffness amongst commonly used printing plates. This gives the big advantage that the thickest plates (e.g. 0.40 mm) as well as the thinner plates (e.g. down to 0.12 mm) are able to follow the guidance member 19 without risk of damage to the latent image.

Second, said inclination angle $\beta$ of the guidance member 19 relates to the exit plane of said guidance member 19 which is upwardly inclined for guiding the printing plate in a well defined path out of the developing bath, preferably such that the leading edge of the outgoing plate is directed tangentially into the nip of an exit pair of rollers 22. According to a preferred embodiment of the present invention, said angle $\beta$ to the horizontal is less than 25°, preferably between 5° and 25°.

With reference to FIGS. 7.1 and 7.2 which a preferred embodiment of said bottom guidance member 19, FIG. 7.1 is a side view indicates both the radius R and the exit angle $\beta$.

Further the concave bottom guidance member 19 preferably has an open mesh structure so as to allow homogeneous penetration and circulation of the developing fluid. It comprises e.g. ground cylindrical bars of an inert material, preferably stainless steel, for minimising chemical interaction between the guidance and the developing fluid and/or the printing plate, for minimising mechanical friction between the guidance and the printing plate and for excluding possible adherence of any sludge to an otherwise plane. In one of the embodiments the basic material for said guidance member 19 is stainless steel following DIN 4401 and it is either highly polished or chromium plated.

As indicated in the plan view of FIG. 7.2 the guidance bars may extend in a V shape at an individual angle $\epsilon$ between 5° and 25°, thus a total of 2$\epsilon$ between 10° and 50°, with respect to the direction of the printing plate. Such V shape brings two interesting advantages. First, the side edges of the printing plate will always be guided on said member 19 without the danger of getting caught under the guidance bars. Second, if any sludge particles should adhere to said guidance member 19, said sludge would be shifted along the bars; so, no sludge particles would be fixed on a same place and hence, no systematic repetitive errors on the plate will occur.

Before the trailing edge of the plate is released by the entrance rollers, its leading edge is gripped by two further rollers 22 called "exit rollers", delivering the printing plate in a direction corresponding to same said natural curvature and which also act as squeegee rollers to remove most of the excess fluid from the surface of the plate.

As the leading edge emerges from the developing bath, at the outlet end of the station a pair of exit rollers 22 squeeze off the excess liquid adhering to the plate, which liquid can be caught by a receptable or feedback to a regeneration system (not shown). Furthermore, the distance between the nip of entrance rollers 21 and the nip of exit rollers 22 for processing any given plate is made shorter than the length of the plate to be processed, said length of the printing plate being measured in its direction of transportation. As the length range of the printing plates may vary e.g. from 370 mm to 1100 mm, the nip to nip distance of the developing bath is e.g. 254 mm.

Thus, besides the already described entrance rollers 21 and bottom guidance member 19, the developing station 12 also comprises a pair of exit rollers 22 for removing the excess developing solution on the surface of the printing plate, both rollers 22 being disposed in substantially parallel relation at a distance from the pair of entrance rollers 21 less than the miminum length of the shortest printing plate to be processed, under an angle $\gamma$ to the horizontal, which is less than 25°, preferably between 5° and 25°, and such that the free trailing end of the printing plate while coming out of the development bath is forced downward into contact with the bottom guidance member, thereby delivering the printing plate in a direction corresponding to same natural curvature.

In one of our preferred embodiments, the upper roller of 22 is journaled in a fixed support and is driven while the lower roller of 22 is mounted in line, directly under the upper roller and mounted under the compressive force of e. g. a spring or an elastic ring (not shown), forcing the lower roller of 22 against the upper roller of 22. In another preferred embodiment, both rollers 22 may be driven.

As the treatment of the plate in this developing station is rather critical in order to attain a high and consistent quality of the developed image, it is absolutely necessary to control very well the guidance of the printing plate in the developing bath with well determined loci and angles of the developing geometry. In reference to FIG. 2, we recapitulate that the plate may not "swim" on the developing fluid (which tendency has been noticed, e.g. when using developer liquids of rather high surface tension or rather high viscosity), nor "dive or splash" uncontrolled in the fluid, neither "sweep out" uncontrolled from said fluid. The described angles have even increased importance as the developing bath is rather shallow, so that the consistency of the printed density suffers extremously from possible variations in the developing level and agitation.

According to a preferred embodiment, the angles $\alpha$, $\beta$ and $\gamma$ are chosen to be different from each other. Experimentally it has been found that particular preferred values are $\alpha=13°$, $\beta=12°$ and $\gamma=15°$.

Figure 4:
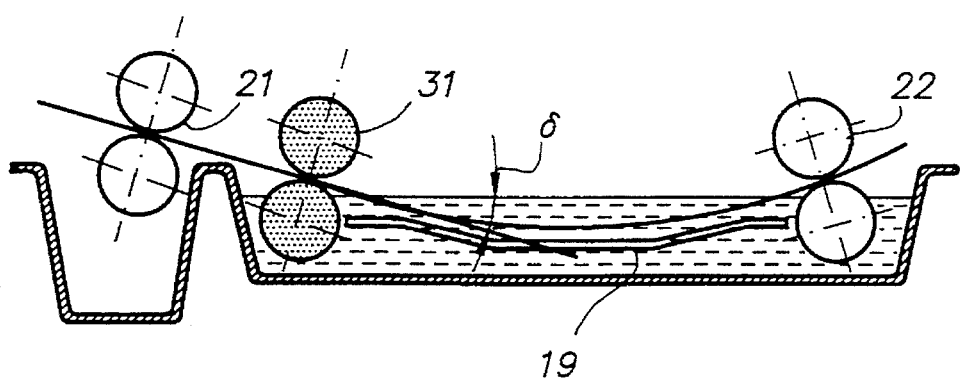
FIG. 4 is another preferred embodiment of a developing station according to the present invention and comprising an extra pair of insertion rollers.

According to another preferred embodiment of the present invention, the apparatus ( see FIG. 4) includes extra means for engaging and driving the printing plate. It comprises a supplementary pair of insertion rollers 31 disposed near the entrance and inside the developing station, one above the other and substantially parallel under an angle $\delta$, less than 25°, preferably between 5° and 25°, to the vertical for further guiding the printing plate in a reproducible way into the developing bath. The lower insertion roller of 31 is immersed in the processing solution of the developing bath whereas the upper roller of 31 just makes contact with the surface of the developing fluid.

While the path of the printing plate into and out of the developing bath is guided by concave bottom guide plate 19, extra guiding means of the plate through the developing bath may be provided by an extra "immersion roller" 32. Said immersion middle roller dips the plate into the liquid and also constraints the plate to follow a path which is close to the above mentioned natural curvature.

Figure 5:
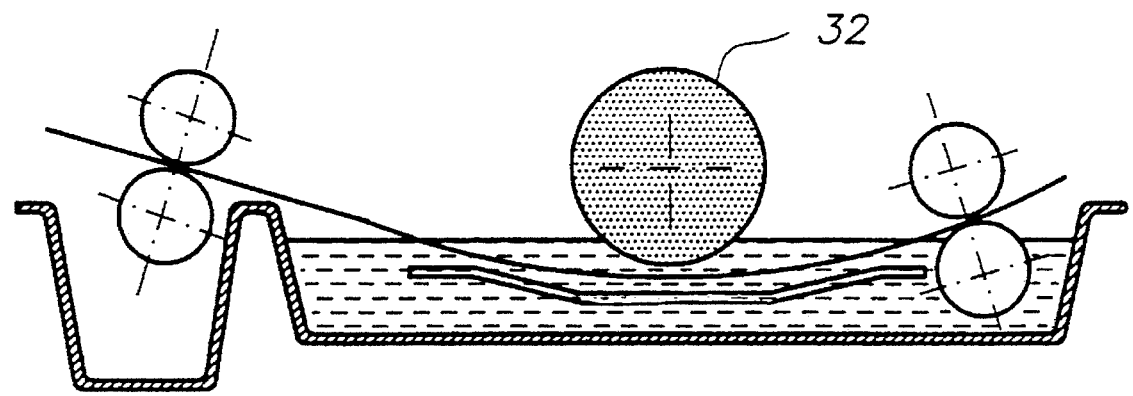
FIG. 5 is another preferred embodiment of a developing station according to the present invention and comprising an extra guidance middle roller.

Therefor, in another preferred embodiment, the apparatus (FIG. 5) may include extra means for guiding the printing plate comprising an immersion roller 32, said roller being disposed preferably "in the middle" between the entrance and the exit rollers of the developing station, while being at least partially immersed in the processing solution of the developing station.

Figure 6:
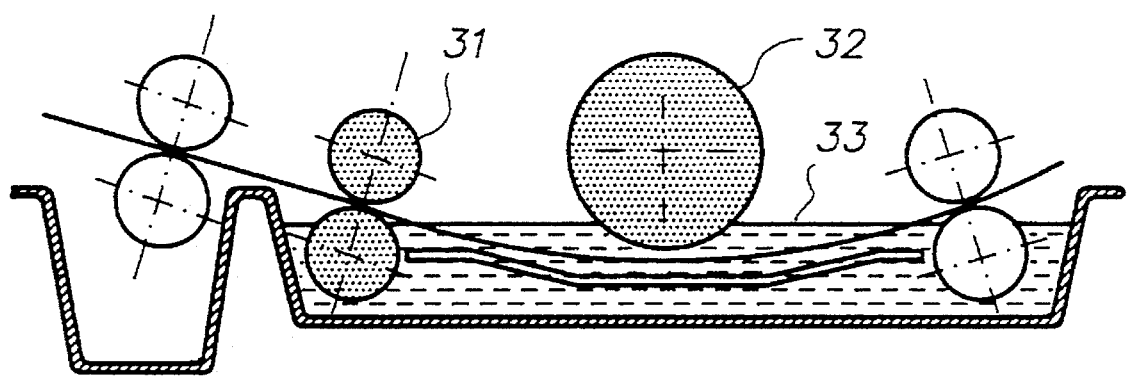
FIG. 6 is a further preferred embodiment of a developing station according to the present invention and comprising both an extra pair of insertion rollers and an extra guidance middle roller.

In still another preferred embodiment of the present invention, the apparatus (see FIG. 6) comprises a pair of entrance rollers 21 as described before, a pair of exit rollers 22 as described before, a bottom guidance member 19 as described before, a pair of insertion rollers 31 as described before, as well as an immersion roller 32 as described before.

The advance of a printing plate through the apparatus 10 is preferably done by rollers (see FIG. 1), representing the conveyor rollers 20, the entrance rollers 21, the exit rollers 22, the squeegee rollers 23 25, the output rollers 26 and possibly the insertion rollers 31 and the immersion roller 32. Each of said rollers, grinded barrel like, preferably has at least the radially outer surfaces formed from an elastomeric material with good spread characteristics for aqueous liquids, as e.g. polyurethane or EPDM (ethylene propylene diene polymer) and having a hardness preferably between 25 and 50 Shore A, as e.g. 40 Shore A.

The range of dimensions (width×length) of the printing plates may vary e.g. from 225 mm×370 mm to 820 mm×1045 mm, the nominal width of the elastomer coating on the rollers is e.g. 850 mm and the nominal diameter of the outer elastomer surface is e.g. 40 mm.

In order to receive a uniform nip pressure and an homogeneous spread of the processing liquid over the variable width of the plate, the plates are preferably transported "centrally", meaning that the middle of the plate always travels along the central plane of the processor 10, and preferably the rollers are grinded slightly barrel like; e.g. the outside diameter being about 0.3 mm greater in the middle.

Note, that if any of the extra rollers 31 and 32, especially those contacting the image bearing surface of the printing plate, should be dry, there is a risk of damage to the image. To avoid this problem, all said rollers 31 and 32 preferably are in contact with or even immersed in the processing solution.

It must be once more appreciated that the length of element to be processed still must be longer than the distance between the nip of rollers 21 and the nip of rollers 22.

Moreover, although the drive rollers of the different stations have a common drive train, each pair of rollers is connected to the drive train by a coupling so as to permit the rollers to be withdrawn from the apparatus without disturbing the drive train.

After some period of use, the processing liquid of the apparatus may deteriorate such that the quality of the processed images becomes unsatisfactory. This deterioration may be caused by different factors. First, the absorption of $CO_2$ from the air by the liquid in the developing bath; next, evaporation which causes the concentration of the processing liquid to change and, finally, oxidation to the air. So the processing liquid in the apparatus should be replaced regularly, independent of the number of developments carried out. This replacement would not only be time consuming and expensive, but would also produce a large number of empty bottles from the fresh processing liquid and a serious amount of unusable processing liquid to be destroyed in an ecologically acceptable way. In order to settle said problems, in a preferred embodiment of the present invention, it is proposed (see FIG. 6 Ref. 33) to overcome deterioration of the processing liquid by providing a cover, e.g. made of polyvinylchloride PVC or of polyurethane PUR, on the free surface of the liquid in the bath and by compensating liquid carried off by processed plates through a replenishing system.

We claim:

1. Apparatus for developing according to the DTR process a lithographic printing plate comprising an elongated support which exhibits a natural deflection curvature under its own weight while supported at opposite ends thereof, said support carrying an imagewise exposed silver halide emulsion layer and in superposed relation to said emulsion layer in effective contact therewith an image receiving layer, in which apparatus the plate is introduced into one end of a bath of a photographic developing solution and removed from an opposite end of said bath, whereby said plate is contacted with said solution to develop said exposed emulsion layer and release therefrom dissolved silver halide for diffusion to said receiving layer to form a silver image therein, the improvement which comprises:

a) At least one pair of rotatable ingress feed rollers for introducing said printing plate into said one end of said bath of said photographic developing solution, the feed rollers of each said pair being arranged one above the other in substantially parallel relation at a location above the bath surface adjacent said one end of the bath and defining a nip for advancing said printing plate along an ingress path substantially tangential to said nip which makes an angle $\alpha$ inclined at least 5° but less than 25° to the horizontal, such ingress feed rollers constituting the sole contact with said printing plate prior to the intersection of said path with said bath surface, b) A pair of rotatable egress rollers for removing said plate from said bath, said egress rollers being arranged one above the other in substantially parallel relation above the bath surface adjacent the other bath end defining a nip for delivering said plate from said bath along an egress path which is substantially tangential to said egress roller nip and inclined at an angle $\gamma$ of less than 25° but more than 5° to the horizontal, and c) Elongated generally arcuate plate guiding means immersed in said bath for guiding the undersurface of said plate while within said bath along an immersion path having a positive curvature which is not substantially greater than the natural deflection curvature of said plate and which at opposite ends thereof is substantially continuous with said ingress and egress paths, the nips of said egress roller pair and at least the adjacent ingress roller pair being separated in the direction of advance of said plate a distance which is less than the length of said plate.

2. Apparatus according to claim 1 which comprises two pairs of ingress rollers arranged in sequence adjacent said one end of said bath so that a plane passing through the nips of said two roller pairs defines said egress path inclined as said angle to the horizontal.

3. Apparatus according to claim 2 wherein the lower roller of the roller pair proximate to the bath surface is partially immersed in said bath to leave the nip of said proximate roller pair above the bath surface.

4. Apparatus according to claim 1 wherein said guiding means comprises an array of elongated guiding bars extending generally in the direction of said immersion path, said bars being spaced apart laterally of said path direction and inclined outwardly thereto from their ingress to their egress ends at an angle e in the range of 5° to 25°.

5. Apparatus according to claim 1 which further comprises an immersion roller disposed intermediate opposite ends of said elongated plate guiding means and in vertically spaced relation thereto, said immersion roller being at least partially immersed in said bath on an opposite side of said immersion path from said guiding means.

6. In a method of developing according to the DTR process a lithographic printing plate comprising an elongated support which exhibits a natural deflection curvature under its own weight while supported at opposite ends thereof, said support carrying an imagewise exposed silver halide emulsion layer and in superposed relation to said emulsion layer in effective contact therewith an image receiving layer, in which apparatus the plate is introduced into one end of a bath of a photographic developing solution and removed from an opposite end of said bath, whereby said plate is contacted with said solution to develop said exposed emulsion layer and release therefrom dissolved silver halide for diffusion to said receiving layer to form a silver image therein, the improvement comprising the steps of:

a) Introducing said printing plate into said one end of said bath of said photographic developing solution by advancing said plate through the nip of at least one pair of rotating ingress feed rollers arranged one above the other in substantially parallel relation located above the bath surface adjacent said one end along an ingress path substantially tangential to said nip which is inclined an angle $\alpha$ of at least 5° but less than 25° to the horizontal and is unconstrained both above and below until at least its intersection with said bath surface, b) Removing said plate from said opposite end of said bath by passage of the plate through the nip of a pair of egress rollers arranged one above the other in substantially parallel relation above the bath surface adjacent the other bath end along an egress path substantially tangential to said egress roller nip which is inclined at an angle $\gamma$ of less than 25° but more than 5° to the horizontal, and c) While said plate is within said bath guiding the undersurface thereof along an immersion path having a positive curvature which is not substantially greater than the natural deflection curvature of said plate and which at opposite ends thereof is substantially continuous with said ingress and egress paths, the nips of said egress roller pair and an adjacent ingress roller pair being separated in the direction of advance of said plate a distance which is less than the length of said plate.

7. The method of claim 6 which comprises advancing said printing plate by two pairs of ingress roller pairs arranged in series adjacent said one end of said bath and defining by a plane passed through the nips thereof said ingress path inclined at said angle to the horizontal.

8. The apparatus of claim 1 wherein said support is aluminum.

9. The method of claim 6 wherein said support is aluminum.

* * * * *